United States Patent [19]

Esaki et al.

[11] 4,163,238

[45] Jul. 31, 1979

[54] INFRARED SEMICONDUCTOR DEVICE WITH SUPERLATTICE REGION

[75] Inventors: Leo Esaki, Chappaqua; Raphael Tsu, Mt. Kisco, both of N.Y.

[73] Assignee: The United States of America as represented by the Secretary of the Army, Washington, D.C.

[21] Appl. No.: 914,099

[22] Filed: Jun. 9, 1978

[51] Int. Cl.² .............................................. H01L 33/00
[52] U.S. Cl. ........................................... 357/17; 357/3; 357/19; 357/16
[58] Field of Search .................... 357/3, 17, 18, 19, 16; 331/94.5 H

[56] References Cited

U.S. PATENT DOCUMENTS

| | | | |
|---|---|---|---|
| 3,626,257 | 12/1971 | Esaki | 317/234 R |
| 3,626,328 | 12/1971 | Esaki | 331/107 G |
| 4,088,515 | 4/1975 | Blakeslee | 148/175 |
| 4,103,312 | 7/1978 | Esaki | 357/16 |

OTHER PUBLICATIONS

Esaki, *Physical Review Letter*, vol. 33, No. 8, Aug. 19, 1974, pp. 495 et seq.

*Primary Examiner*—Martin H. Edlow
*Attorney, Agent, or Firm*—Nathan Edelberg; Sheldon Kanars; Jeremiah G. Murray

[57] ABSTRACT

It is taught that infrared light can be produced by applying a voltage to a semiconductor device with a superlattice region and, further, that a population inversion can be achieved in such a device so that infrared amplification and oscillation can be produced. Methods of producing infrared radiation and of amplifying infrared radiation utilizing semiconductor devices with superlattice regions are disclosed. Also, semiconductor devices with superlattice regions for use as a laser amplifier or oscillator are taught.

13 Claims, 5 Drawing Figures

INFRARED SEMICONDUCTOR DEVICE WITH SUPERLATTICE REGION

The invention described herein may be manufactured and used by or for the Government for governmental purposes without the payment of any royalties thereon or therefor.

FIELD OF THE INVENTION

This invention relates to electro-optical semiconductor devices and particularly to such electro-optical semiconductor devices which include a superlattice region.

BACKGROUND OF THE INVENTION

On Dec. 7, 1971, two patents issued to one of the coinventors hereof, Leo Esaki, such patents being U.S. Pat. Nos. 3,626,257 and 3,626,328 entitled "Semiconductor Device with Superlattice Region" and "Semiconductor Bulk Oscillator", respectively, both of which are incorporated herein by reference. These patents teach how to produce semiconductor devices with superlattice regions, the electrical properties thereof, and point out the prior state of the art with respect to theoretical considerations involving wave propagation in periodic structures, and the bulk negative resistance devices resulting therefrom.

Light emitting semiconductor devices as well as semiconductor laser amplifiers and oscillators are well known. These devices employ the allowed conduction and valence band states which are characteristic of the materials themselves. For a discussion of semiconductor lasers, see the book entitled "The Laser" by Smith and Sorokin, McGraw-Hill Book Company, Copyright 1966, and particularly Chapter 7 thereof.

BRIEF DESCRIPTION OF THE INVENTION

It has been found in accordance with this invention that superlattice semiconductor structures employing alternating layers of thin semiconductor materials have allowed states therein which are separated by energies corresponding to light frequencies, particularly in the infrared region. Such allowed states are not present in either of the materials which form the semiconductor superlattice. The present invention goes on to teach a method of illuminating a preselected area including the steps of arranging a superlattice semiconductor element having a plurality of layers, at least one of which has an exposed edge facing the preselected area, and applying a voltage across the superlattice semiconductor element transverse to the layers thereof to illuminate such preselected area.

According to the present invention, there is also provided an optical device comprising a superlattice semiconductor element, said semiconductor element including a plurality of alternating barrier and light emitting layers, said light emitting layers each having a pair of allowed states separated by an energy corresponding to a light frequency, means for applying a voltage across said superlattice semiconductor element transverse to said layers, and means for conveying light corresponding to said light frequency to said light emitting layers.

DESCRIPTION OF THE DRAWINGS

For a more complete understanding of the invention, reference should be made to the following detailed description and drawings, wherein.

DETAILED DESCRIPTION OF THE INVENTION

Figures 1, 5:
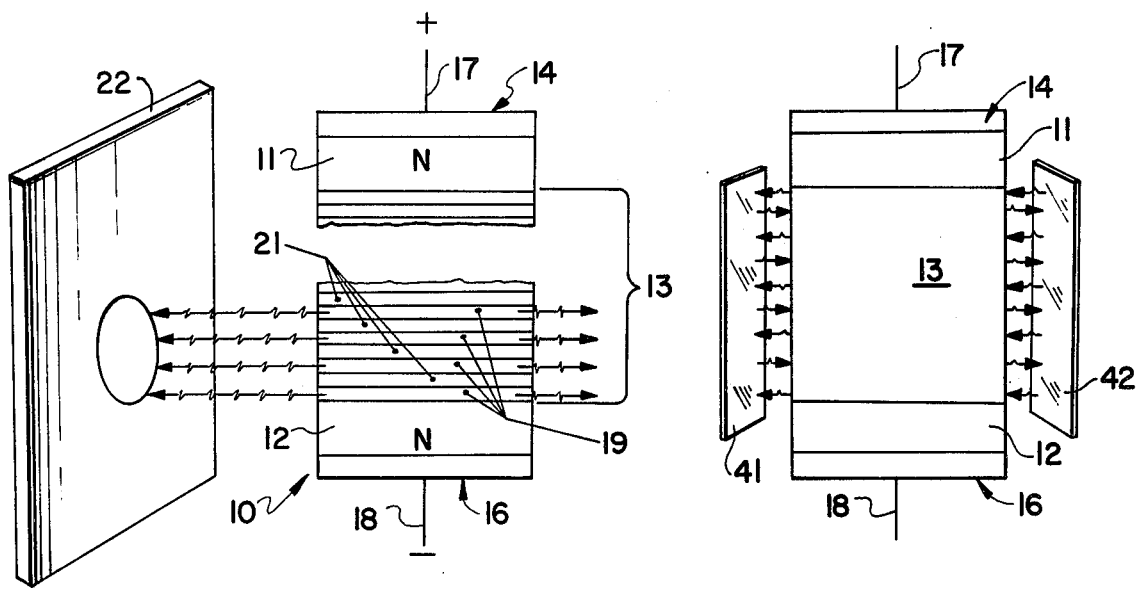
FIG. 1 is a schematic representation of a cross-section of an optical device constructed in accordance with the present invention.
FIG. 5 is a schematic representation of a superlattice semiconductor device employed as a laser oscillator in accordance with the teachings of this invention.

Referring now to FIG. 1, we see a schematic representation of a semiconductor structure 10 which includes two end portions 11 and 12 which are N-type materials separated by a central portion 13 which includes a superlattice region. Two ohmic contacts 14 and 16 are connected to the N-type regions 11 and 12, respectively. Voltage is applied by a source (not shown) across the ohmic contacts 14 and 16 via leads 17 and 18.

The superlattice region 13 includes alternate light emitting layers 19 and barrier layers 21, respectively, which may be formed by alloying. In the preferred embodiment of the invention, the main body of the semiconductor device is gallium arsenide with the N+ regions 11 and 12 highly doped to be N+ type gallium arsenide. The light emitting layers 19 are N-type gallium arsenide although not heavily doped N-type, and the barrier layers 21 are the alloy $Ga_xAl_{1-x}As$ where x would typically be between 0.9 and 0.6.

The gallium aluminum arsenide alloy has a higher band gap than gallium arsenide itself and thus the superlattice is formed with the desired periodic structure. The smaller the value of x in such a structure, the greater is the spatial variation in the energy band gap. Other alloy systems are disclosed in U.S. Pat. No. 3,626,328.

Figure 2:
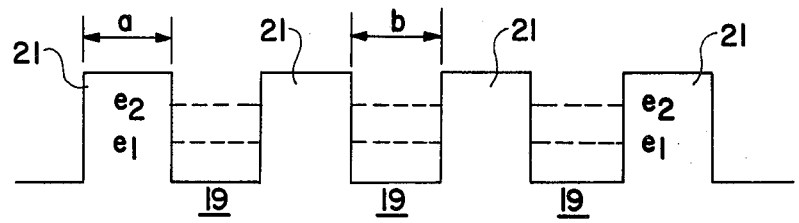
FIG. 2 is an energy level diagram of a superlattice structure in accordance with this invention without an externally applied voltage.

FIG. 2 shows the conduction band energy diagram for the superlattice region 13 of FIG. 1. It will be noted that the energy periodically varies from a higher conduction band energy corresponding to the layers 21 to a lower conduction band energy corresponding to the layers 19.

Figure 3:
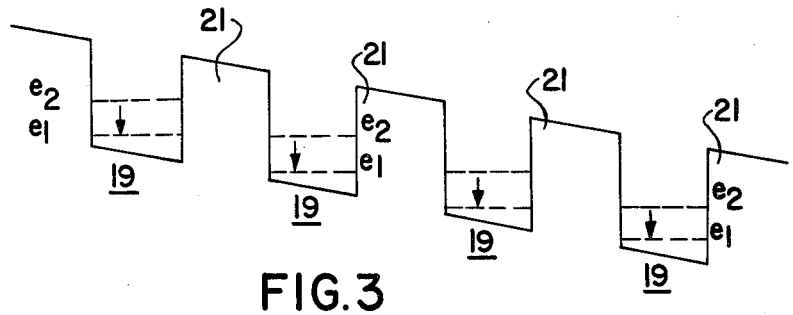
FIG. 3 is an energy level diagram of a superlattice structure in accordance with this invention with an externally applied voltage.

It has previously been realized that the normal conduction band energy levels are modified in this configuration to produce supplementary allowed levels such as those shown as $e_1$ and $e_2$ in FIG. 2 in the superlattice structure. Thus, for example, if the layers 19 are gallium arsenide and 100 angstroms thick while the layers 21 are gallium aluminum arsenide and also 100 angstroms thick, the level $e_1$ would be 0.1 electron volts while the level $e_2$ would be 0.3 electron volts. In accordance with this invention, it has been realized that with a field (approximately $10^5$ volts per centimeter) applied across the superlattice region 13, the energy diagram of FIG. 2 is modified as shown in FIG. 3. In such event, the level $e_1$ of the left-most layer 19 becomes level with the level $e_2$ in the next succeeding layer 19. Because of the thinness of the layers 21, electrons tunnel from the level $e_1$ to the upper level $e_2$ in the next layer 19. It has been determined that in the configuration discussed, the tunneling time from one layer 19 to the next layer 19 is governed by the barrier height and width, typically will be in the order of magnitude of $10^{-12}$ seconds. It has also been determined that the life time of electrons in the upper state $e_2$ will be approximately $10^{-10}$ seconds. Thus, it can be seen that with the field applied a current will flow across the superlattice region resulting in electrons filling the upper states $e_2$ while the lower states $e_1$ will be depopulated by the tunneling effect. Therefore, a population inversion is achieved. The transition of electrons from the upper state $e_2$ to the state $e_1$ (whether spontaneously or stimulated) will result in the emission of infrared radiation having an energy of 0.2 electron volts which have approximately a 5 micron wavelength.

It can be appreciated from the above that the superlattice is, in fact, an electro-optical device and can be operated as a source of infrared radiation, can be employed to amplify infrared radiation, or can be employed as an infrared laser oscillator. It should be noted that the population inversion is achieved because the tunneling time is fast compared with the upper state life time. A population inversion is necessary for amplification or oscillation. Light emission is still achieved without a population inversion though amplification or oscillation of the light is not possible.

In order to obtain a population inversion, the life time of the upper state $e_2$ must be longer than the tunneling time. Thus the layer 21 must be no thicker than 150 angstroms. However, too thin a barrier layer results in broader energy states. Therefore, the thickness of the layer 21, in the range of 50 to 150 angstroms, will satisfy the conditions for population inversion and narrow spectral emission.

When the superlattice region 13 shown in FIG. 1 is arranged with certain of the exposed edges of the layers 19 directed towards a preselected area 23 on a surface 22, the preselected area 23 will be illuminated when a voltage is applied across the superlattice region 13 transverse to the layers 19 and 21. It is noted that the illumination is not visible being infrared light. Also, the applied voltage must be sufficient to raise the electrons in the $e_1$ level to the $e_2$ level. It is believed that the minimum applied voltage for devices of the present invention is $10^5$ volts per $cm^2$.

Figure 4:
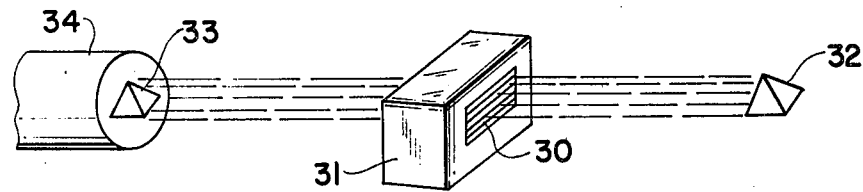
FIG. 4 is a schematic representation of a superlattice semiconductor device employed as a light amplifier in accordance with the teachings of this invention.

In FIG. 4, we see how an array of superlattice elements in a device 31 can be employed as an image intensification device. Thus, each of the superlattice regions within array 30 is employed as an infrared amplifier to receive infrared radiation from an object 32. The infrared radiation is selectively amplified by each of the superlattice regions within array 30 to provide an intensified infrared image 33, which can be transformed to visible light for direct viewing, sensed by a sensor 34, which could be an infrared vidicon tube.

In FIG. 5, we see that a superlattice region according to the present invention can be employed as an infrared laser oscillator by providing parallel reflectors 41 and 42 on opposite edges of the layers 19. It is of course obvious that the reflectors 41 and 42 could be integral with the superlattice region, such as merely being silvered on the edges thereof.

While this invention has been described with respect to particular embodiments hereof, numerous others will become obvious to those of ordinary skill in the art in light hereof, and it is therefore not intended that the foregoing description be read in a limiting sense, and that the scope of the invention be defined by the appended claims.

What is claimed is:

1. An optical device comprising a superlattice semiconductor element, said semiconductor element including a plurality of alternating barrier and light emitting layers, said light emitting layers each having a pair of allowed states separated by an energy corresponding to a light frequency, means for applying a voltage across said superlattice semiconductor element transverse to said layers, and means for conveying light corresponding to said light frequency to said light emitting layers.

2. An optical device according to claim 1, wherein the barrier layers are of a thickness of from 50 to 150 angstroms.

3. An optical device according to claim 2, wherein said barrier layers are composed of gallium aluminum arsenide, and said light emitting layers are composed of gallium arsenide.

4. An optical device according to claims 1, 2 or 3, wherein the thickness of the barrier layers is such that the tunneling time is faster than the upper state life time in the light emitting layers.

5. An optical device according to claim 1, wherein the said light frequency is in the infrared region.

6. An optical device according to claim 1, wherein the said light frequency is in the infrared region.

7. An optical device according to claim 6, wherein the said applied voltage is at least 10 volts per $cm^2$.

8. An optical device according to claim 6 or 7, wherein the optical device is an amplifier.

9. An optical device according to claim 6 or 7, wherein the optical device comprises reflecting mirrors permitting the optical device to function as an oscillator.

10. A method of applying light to a desired area including the steps of arranging a superlattice semiconductor element having a plurality of alternating barrier and light emitting layers, said light emitting layers each having a pair of allowed states separated by an energy corresponding to a light frequency, exposing at least a portion of an edge of one of said layers having said pair of allowed states, facing said exposed portion towards said preselected area, and applying a voltage across said superlattice semiconductor element transverse to said layers.

11. A method according to claim 10, further including the steps of providing barrier layers of such a thickness that the tunneling time is faster than the upper state life time in the light emitting layers so that a population inversion is achieved in the light emitting layers.

12. A method according to claim 11, further including the step of operating the superlattice semiconductor element as an amplifier.

13. A method according to claim 11, further including the step of operating the superlattice semiconductor element as an oscillator.

* * * * *